(12) United States Patent
Zhou et al.

(10) Patent No.: US 10,672,910 B2
(45) Date of Patent: Jun. 2, 2020

(54) THRESHOLD VOLTAGE ADJUSTMENT FROM OXYGEN VACANCY BY SCAVENGE METAL FILLING AT GATE CUT (CT)

(71) Applicant: INTERNATIONAL BUSINESS MACHINES CORPORATION, Armonk, NY (US)

(72) Inventors: Huimei Zhou, Albany, NY (US); Ruqiang Bao, Niskayuna, NY (US); Michael P. Belyansky, Halfmoon, NY (US); Andrew M. Greene, Albany, NY (US); Gen Tsutsui, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/059,693

(22) Filed: Aug. 9, 2018

(65) Prior Publication Data

US 2020/0052125 A1   Feb. 13, 2020

(51) Int. Cl.
| | |
|---|---|
| *H01L 21/336* | (2006.01) |
| *H01L 29/78* | (2006.01) |
| *H01L 21/28* | (2006.01) |
| *H01L 29/49* | (2006.01) |
| *H01L 21/02* | (2006.01) |
| *H01L 29/06* | (2006.01) |
| *H01L 21/8238* | (2006.01) |
| *H01L 21/762* | (2006.01) |

(52) U.S. Cl.
CPC ...... *H01L 29/7856* (2013.01); *H01L 21/0228* (2013.01); *H01L 21/28088* (2013.01); *H01L 21/762* (2013.01); *H01L 21/823821* (2013.01); *H01L 29/0649* (2013.01); *H01L 29/0673* (2013.01); *H01L 29/4966* (2013.01)

(58) Field of Classification Search
CPC ............. H01L 29/4966; H01L 29/0673; H01L 21/0228
See application file for complete search history.

(56) References Cited

U.S. PATENT DOCUMENTS

| | | |
|---|---|---|
| 7,337,420 B2 | 2/2008 | Chidambarrao et al. |
| 8,409,951 B2 | 4/2013 | Liang et al. |
| (Continued) | | |

OTHER PUBLICATIONS

Fang, Y. et al., "Improvement of HfOx-based RRAM Device Variation by inserting ALD TiN Buffer Layer" IEEE Electron Device Letters (Jun. 2018) pp. 1-4, vol. 39, issue 6.

(Continued)

*Primary Examiner* — Samuel A Gebremariam
(74) *Attorney, Agent, or Firm* — Tutunjian & Bitetto, P.C.; Vazken Alexanian

(57) ABSTRACT

A method of controlling threshold voltage shift that includes forming a first set of channel semiconductor regions on a first portion of a substrate, and forming a second set of channel semiconductor regions on a second portion of the substrate. A gate structure is formed on the first set of channel semiconductor regions and the second set of channel, wherein the gate structure extends from a first portion of the substrate over an isolation region to a second portion of the substrate. A gate cut region is formed in the gate structure over the isolation region. An oxygen scavenging metal containing layer is formed on sidewalls of the gate cut region.

9 Claims, 6 Drawing Sheets

(56) References Cited

U.S. PATENT DOCUMENTS

| | | |
|---|---|---|
| 8,766,379 B2 | 7/2014 | Liu et al. |
| 9,947,667 B2 | 4/2018 | Kang et al. |
| 2014/0077313 A1 | 3/2014 | Li et al. |
| 2017/0092732 A1 | 3/2017 | Yeo et al. |
| 2017/0148888 A1 | 5/2017 | Clark et al. |

OTHER PUBLICATIONS

Robertson, J. et al., "High-K materials and Metal Gates for CMOS applications" Materials Science and Engineering: R: Reports (Dec. 2014) pp. 1-77, vol. 88.

Xiang, J. et al., "Understanding the Role of TiN Barrier Layer on Electrical Performance of MOS Device with ALD-TiN/ALD-TiAlC Metal Gate Stacks" ECS Journal of Solid State Science and Technology (Apr. 2016) pp. P327-P329, vol. 3, No. 6.

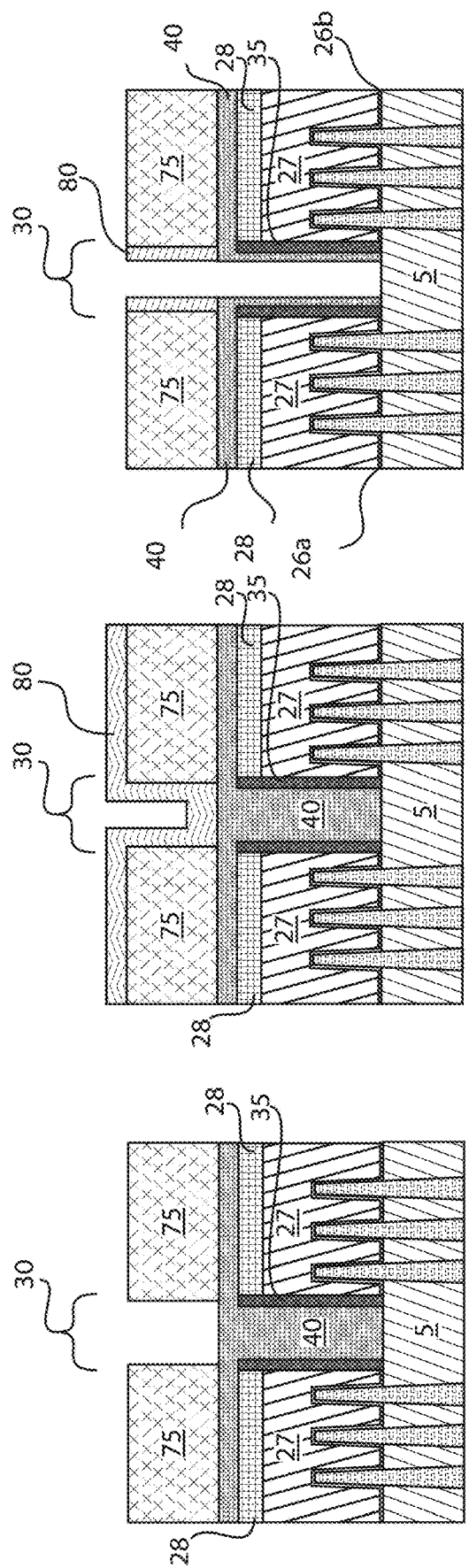

US 10,672,910 B2

THRESHOLD VOLTAGE ADJUSTMENT FROM OXYGEN VACANCY BY SCAVENGE METAL FILLING AT GATE CUT (CT)

BACKGROUND

Technical Field

The methods and structures described herein relate to gate structures used in semiconductor devices, and methods for controlling threshold voltage (Vt) shifts in semiconductor devices.

Description of the Related Art

Modern integrated circuits are made up of literally millions of active devices such as transistors. Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Continuing trends in semiconductor device manufacturing include a reduction in electrical device feature size (scaling). With increasing scaling, new phenomena are being discovered that can result in threshold voltage shifts that degrade device performance.

SUMMARY

In one embodiment, a method of controlling threshold voltage shift is provided that includes employing an oxygen scavenging metal. In one embodiment, the method includes forming a first set of channel semiconductor regions on a first portion of a substrate, and forming a second set of channel semiconductor regions on a second portion of the substrate. A gate structure is formed on the first set of channel semiconductor regions and the second set of channel, wherein the gate structure extends from a first portion of the substrate over an isolation region to a second portion of the substrate. A gate cut region is formed in the gate structure over the isolation region. An oxygen scavenging metal containing layer is formed on sidewalls of the gate cut region. A dielectric fill is formed on the oxygen scavenging metal containing layer filling gate cut region.

In another aspect, a semiconductor device including semiconductor fin structures is provided that includes an oxygen scavenging metal containing layer on the sidewalls of a gate structure at the interface with a gate cut region. In one embodiment, the semiconductor device includes a first set of semiconductor fin structures on a first portion of a substrate, and a second set of semiconductor fin structures on a second portion of the substrate. The first and second portions of the substrate containing the first and second sets of semiconductor fin structures are separated by an isolation region. A first gate structure is present on the first set of semiconductor fin structures, and a second gate structure is present on the second set of semiconductor fin structures. A gate cut isolation region is present over the isolation region. An oxygen scavenging metal containing layer is present on sidewalls of the gate cut isolation region that separates the gate cut isolation region from the first and second gate structures.

In yet another aspect, a semiconductor device including nanosheets is provided that includes an oxygen scavenging metal containing layer on the sidewalls of a gate structure at the interface with a gate cut region. In one embodiment, the semiconductor device includes a first set of nanosheets on a first portion of a substrate, and a second set of nanosheets on a second portion of the substrate. The first and second portions of the substrate containing the first and second sets of nanosheets are separated by an isolation region. A first gate structure is present on the first set of nanosheets, and a second gate structure is present on the second set of nanosheets. A gate cut isolation region is present over the isolation region. An oxygen scavenging metal containing layer is present on sidewalls of the gate cut isolation region that separates the gate cut isolation region from the first and second gate structures.

BRIEF DESCRIPTION OF DRAWINGS

The following description will provide details for some of the preferred embodiments with reference to the following figures wherein:

FIG. 13 is a side cross-sectional view depicting forming a second patterning layer stack on the structure depicted in FIG. 5.

FIG. 14 is a side cross-sectional view depicting forming a masking layer within an opening through the second patterning layer stack that is depicted in FIG. 13.

FIG. 15 is a side cross-sectional view depicting etching the fill that is present in the gate cut region using the masking layer depicted in FIG. 14.

DETAILED DESCRIPTION OF PREFERRED EMBODIMENTS

Figure 1:
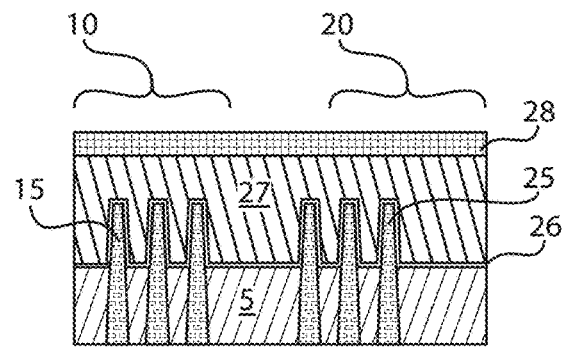
FIG. 1 is a side cross-sectional view depicting one embodiment of a first set of semiconductor fin structures on a first portion of a substrate, a second set of semiconductor fin structures on a second portion of the substrate, and a gate structure is formed on the first set of channel semiconductor regions and the second set of channel, wherein the gate structure extends from a first portion of the substrate over an isolation region to a second portion of the substrate.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present description. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. As used herein a "field effect transistor" is a transistor in which output current, i.e., source-drain current, is controlled by the voltage applied to the gate. A field effect transistor has three terminals, i.e., gate structure, source region and drain region. A "gate structure" means a structure used to control output current (i.e., flow of carriers in the channel) of a semiconducting device through electrical or magnetic fields. As used herein, the term "channel" is the region underlying the gate structure and between the source and drain of a semiconductor device that becomes conductive when the semiconductor device is turned on. As used herein, the term "source" is a doped region in the semiconductor device, in which majority carriers are flowing into the channel. As used herein, the term "drain" means a doped region in semiconductor device located at the end of the channel, in which carriers are flowing out of the transistor through the drain.

In some embodiments, the gate cut (CT) process sequence as part of the replacement metal gate (RMG) process was developed to allow for tighter design rules to allow for increased scaling, i.e., design shrink, for complementary metal oxide semiconductor (CMOS) device arrangements; and to reduce the source/drain capacitance by minimizing the presence of the gate conductor (PC) past the active region (RX) of the device. It has been determined that the gate cut (CT) that is employed in the replacement metal gate causes threshold voltage (Vt) modulation, in which the magnitude of the threshold voltage (Vt) modulation may be inversely correlated to the number of active fins. Oxygen vacancy is one of the causes of the threshold voltage (Vt) shift introduced by the gate cut (CT) cut process.

It has been determined that scavenging metal deposition in the gate cut region can pull back the threshold voltage (Vt). It has been determined that the threshold voltage (Vt) adjustment from oxygen vacancy by scavenging metal filling at the gate cut (CT) can eliminate layout effect of small fin number and large fin numbers. The threshold voltage (Vt) adjustment can be made from fill in scavenge metals, such atomic layer deposition (ALD) formed titanium (Ti), aluminum (Al), titanium aluminum (TiAl), titanium aluminum carbon (TiAlC) and combinations thereof. More specifically, the scavenge metal may be formed in the gate cut, and then a second cut, i.e., etch, may remove a majority of the scavenge metal, which leaves a little of the scavenge metal at the edge of the gate cut. The oxygen vacancy can drive the threshold voltage (Vt) to be lower for NFET when compared to the PFET. The method and structures for employing gate cuts with integrated etch stop layers, are now described in more detail with reference to FIGS. 1-16.

FIG. 1 depicting one embodiment of a first set of semiconductor fin structures 15 on a first portion 10 of a substrate, a second set of semiconductor fin structures 25 on a second portion 20 of the substrate, and a gate structure 26 is formed on the first set of semiconductor fin structures 15 and the second set of semiconductor fin structures 25, wherein the gate structure 26 extends from a first portion 10 of the substrate over an isolation region to a second portion 20 of the substrate.

As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. The portions of the fin structure adjacent on the opposing sides of the channel portion are the source and drain region portions of the fin structure. The source and drain regions of the semiconductor devices may be doped to an n-type or p-type conductivity. The fin structures may be composed of a type IV semiconductor, such as silicon (Si), germanium (Ge) or a combination thereof, e.g., silicon germanium (SiGe), or the fin structures may be composed of a type III-V semiconductor, such as gallium arsenic (GaAs).

The first portion 10 the substrate is separated from the second portion 20 of the substrate by an isolation region 5. In some embodiments, the isolation region 5 is provided by a dielectric material. For example, the isolation region 5 may be composed of silicon oxide ($SiO_2$).

Still referring to FIG. 1, a gate stack 26 may be formed over the first and second sets of fin structures 15, 25, as well as, being formed over the first region 10 of the substrate, the second region 20 of the substrate, and the isolation region 5. The gate stack 26 may be composed of a gate dielectric layer, such as a high-k gate dielectric layer, that is present on the channel surfaces of the fin structures, and a work function (WF) metal layer that is present atop the gate dielectric layer. In some embodiments, an interfacial oxide, such as silicon oxide ($SiO_2$), may be present between the gate dielectric layer and the channel surfaces of the fin structures.

A high k material is a dielectric having a dielectric constant greater than silicon oxide at room temperature, e.g., 20° C. to 25° C. Exemplary high-k dielectrics suitable for the high-k gate dielectric layer include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2ON_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The gate dielectric layer can be formed by chemical vapor deposition (CVD), such as plasma enhanced chemical vapor deposition (PECVD), metal organic chemical vapor deposition (MOCVD), or atomic layer deposition (ALD).

The work function metal layer may be a p-type work function metal layer or an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer is composed of titanium nitride (TiN). The p-type work function metal layer may also be composed of TiAlN, Ru, Pt, Mo, Co and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of titanium nitride (TiN). In another embodiment, the n-type work function metal layer is composed of at least one of TiAl, TaN, HfN, HfSi, or combinations thereof.

In some embodiments, different work function metal layers may be formed in the first and second region 10, 20.

The work function metal layer can be formed using a deposition process, such as chemical vapor deposition, e.g., plasma enhanced chemical vapor deposition (PECVD); physical vapor deposition (PVD), e.g., sputtering; or plating, e.g., electroplating and/or electroless plating.

Still referring to FIG. 1, an organic planarization layer (OPL) 27 is formed atop the first region 10 of the substrate, the second region 20 of the substrate and the isolation region 5. Following the formation of the OPL layer 27, an anti-reflection coating (ARC) or low temperature oxide (LTO) layer (not shown) is deposited followed by a resist mask 28. The organic planarization layer (OPL) layer 27 may be composed of an organic polymer that may include polyacrylate resin, epoxy resin, phenol resin, polyamide resin, polyimide resin, unsaturated polyester resin, polyphenylenether resin, polyphenylenesulfide resin, or benzocyclobutene (BCB). The OPL layer 27 should be baked at a temperature at or above the subsequent processing steps to ensure no out-gassing and contamination. In some embodiments, the organic planarization layer (OPL) 27 is deposited from solution, e.g., by spin on deposition, and is baked at high temperature.

In the embodiments that employ a low temperature oxide, the low temperature oxide, e.g., silicon oxide ($SiO_2$), can be deposited by chemical vapor deposition (CVD) at temperatures of less than 400° C.

In the embodiments, that employ an anti-reflective coating, the anti-reflective coating (ARC) can be composed of silicon oxynitride (SiON) that is deposited using chemical vapor deposition (CVD), such as plasma enhanced chemical vapor deposition (PECVD) or low temperature chemical vapor deposition.

The photoresist mask 28 may be deposited using spin on deposition and/or chemical vapor deposition.

Figure 2:
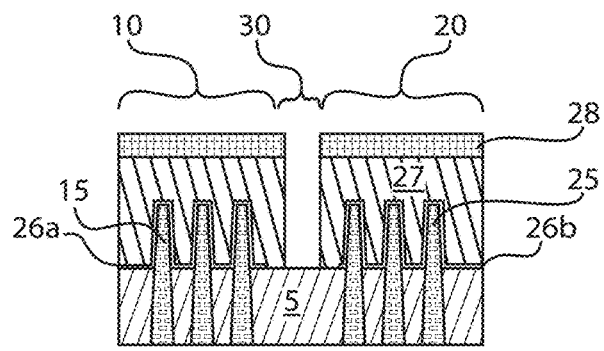
FIG. 2 is a side cross-sectional view depicting forming a gate cut opening in the gate structure that is depicted in FIG. 1.

FIG. 2 depicts forming a gate cut opening 30 in the organic planarization layer 27, as well as the portion of the gate stack that is present on the isolation region 5. Forming the gate cut opening 30 may begin with removing the portion of the organic planarization layer 27 that is present between the first and second regions 10, 20 of the substrate, which is atop the isolation region 5. Removing this portion of the organic planarization layer can begin with patterning the photoresist mask 28. The photoresist mask 28 may be patterned to protect the portion of the OPL, as well as the LTO and/or SiARC, that is present overlying the first and second regions 10, 20 of the substrate, and to expose the portion of the OPL 27 that is present over the isolation region 5. The exposed portion of the OPL layer 27, as well as the exposed portions of the LTO and/or SiARC layer, are then removed by an etch process. For example, the exposed portion of the OPL layer 27 may be removed to provide the upper portion of the gate cut region 35. The etch process may be an anisotropic etch, such as reactive ion etching (RIE).

Still referring to FIG. 2, following removing the exposed portion of the OPL layer 27, the portion of the gate stack 26 that is present over the isolation region 5 may be removed by an etch process, such as reactive ion etching (RIE) or wet chemical etch. Following removal of the portion of the gate stack 26 that is present over the isolation region 5, a first remaining portion provides the first gate stack 26a that is present on the first set of fin structures 15 in the first region 10, and a second remaining portion provides the second gate stack 26b that is present on the second set of fin structures 25 in the second region 20. The portion of the gate stack 26 that is removed provides the lower portion of the gate cut region 30. It is noted that this step of the process flow can introduce oxygen vacancies to the structure. To avoid the generation of oxygen vacancies, an oxygen scavenging material layer is formed on the exposed sidewalls of the gate cut region 30.

Figure 3A:
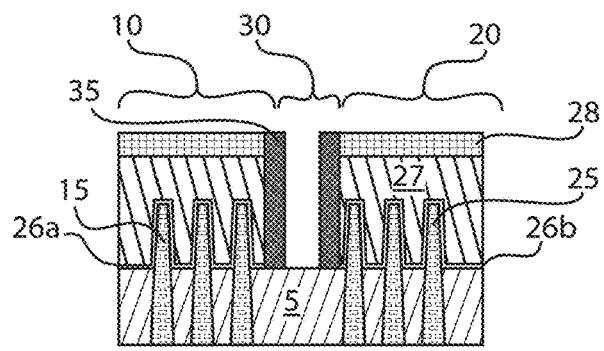
FIG. 3A is a side cross-sectional view depicting an oxygen scavenging metal containing layer being formed on sidewalls of the gate cut region, in accordance with one embodiment of the present disclosure.
Figure 3B:
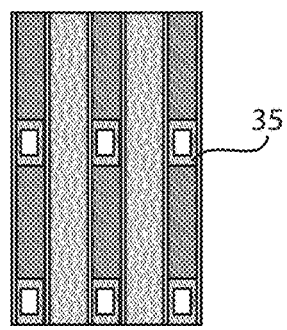
FIG. 3B is a top down view of the structure depicted in FIG. 3A.

FIGS. 3A and 3B depicting an oxygen scavenging metal containing layer 35 being formed on sidewalls of the gate cut region 30. The oxygen scavenging metal containing layer 35 may be composed of any material that attracts oxygen and/or bonds with oxygen to keep oxygen from forming oxygen vacancies in the gate structures 26a, 26b. In some embodiments, the oxygen scavenging metal containing layer 35 may be composed of titanium (Ti), aluminum (Al), titanium aluminum (TiAl), titanium aluminum carbon (TiAlC) and combinations thereof. The oxygen scavenging metal containing layer 35 may be conformally deposited on both horizontal and vertical surfaces of the structure depicted in FIG. 2. The term "conformal" denotes a layer having a thickness that does not deviate from greater than or less than 30% of an average value for the thickness of the layer.

In some embodiments, the oxygen scavenging metal containing layer 35 may be deposited using atomic layer deposition. Atomic Layer Deposition (ALD) uses self-limiting surface reactions to deposit material layers in the monolayer or sub-monolayer thickness regime. ALD is similar in chemistry to chemical vapor deposition (CVD), except that the ALD reaction breaks the CVD reaction into two half-reactions, keeping the precursor materials separate during the reaction. In some embodiments, the atomic layer deposition (ALD) process may be a thin film deposition method in which a film is grown on a substrate by exposing its surface to alternate gaseous species (typically referred to as precursors). In contrast to chemical vapor deposition, the precursors are never present simultaneously in the reactor, but they are inserted as a series of sequential, non-overlapping pulses. In each of these pulses the precursor molecules react with the surface in a self-limiting way, so that the reaction terminates once all the reactive sites on the surface are consumed.

In some embodiments, the monolayer deposition provided by the atomic layer depositions mechanisms provides that the layer be conformal. The conformal oxygen scavenging metal containing layer 35 may have a thickness ranging from 1 nm to 10 nm. In some embodiments, the conformal oxygen scavenging metal containing layer 35 may have a thickness ranging from 1 nm to 5 nm.

Following deposition of the conformal oxygen scavenging metal containing layer 35, an anisotropic etch process, such as reactive ion etch (RIE) may be used to remove the horizontally orientated portions. In some embodiments, due to the anisotropic nature of the etch process, and the greater height (as measured from the upper surface of the substrate) of the vertically orientated portions of the conformal oxygen scavenging metal containing layer 35 relative to the horizontally orientated portions of the conformal oxygen scavenging metal containing layer 35, the vertically orientated portions of the oxygen scavenging metal containing layer 35 may remain on the sidewalls of the gate cut region 30, as depicted in FIGS. 3A and 3B.

Figure 4B:
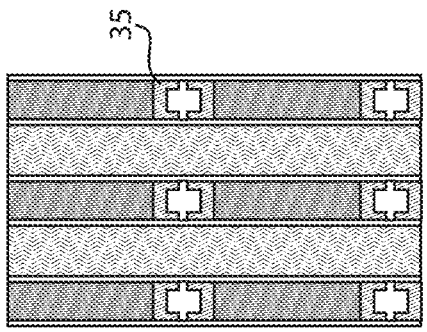
FIG. 4B is a top down view of the structure depicted in FIG. 3A.
Figure 4A:
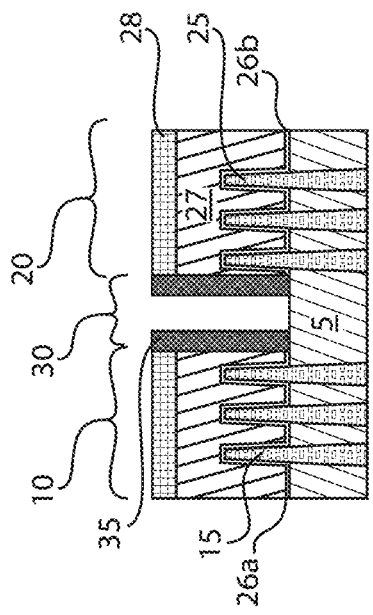
FIG. 4A is a side cross sectional view of an etch process to form a cut region in the oxygen scavenging metal.

FIGS. 4A and 4B illustrate one embodiment of an etch process for removing a connecting portion of the oxygen scavenging metal containing layer 35. The etch process may be provided by anisotropic etching, such as reactive ion etching. The etch process may be used in combination with masking to protect the portions of the oxygen scavenging metal containing layer 35 that is present on the sidewalls of the gate cut region 30 that reduce the formation of oxygen vacancies. The etch process depicted in FIGS. 4A and 4B ensures that the oxygen scavenging metal containing layer 35 does not provide the source of shorting between the devices formed in the first region 10 of the device, and the devices formed in the second region 20 of the device.

Figure 5:
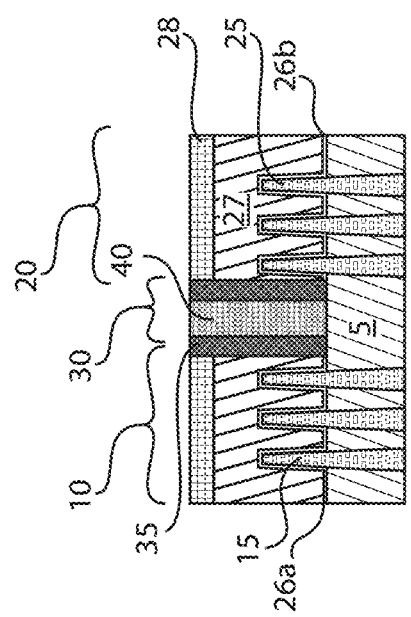
FIG. 5 is a side cross-sectional view depicting a dielectric fill being formed on the oxygen scavenging metal containing layer filling gate cut region.

FIG. 5 depicts a dielectric fill 40 being formed on the oxygen scavenging metal containing layer 35 filling gate cut region 30. The dielectric fill 40 the may be a nitride containing dielectric. In some embodiments, the dielectric fill 40 may be composed of silicon nitride. The dielectric fill 40 may be deposited using a chemical vapor deposition (CVD) process that may include Atmospheric Pressure CVD (APCVD), Low Pressure CVD (LPCVD), Plasma Enhanced CVD (PECVD), Metal-Organic CVD (MOCVD) and combinations thereof. In some embodiments, the dielectric fill 40 may be deposited to fill the entirety of the gate cut trench, i.e., gate cut region 30. In some embodiments, a portion of the nitride containing dielectric fill 40 may overfill the gate cut trench. In this instance a planarization process may be employed to remove the overfill.

Figure 6:
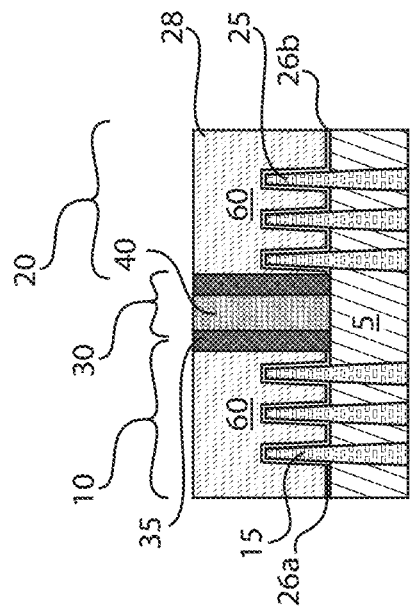
FIG. 6 is a side cross-sectional view depicting forming gate electrode contacts.

Referring to FIG. 6, the remaining portions of the organic planarization layer 27 may be removed using a selective etch process, and an electrode contact 40 may be formed to each of the gate stacks 26a, 26b. The electrode contact 40 may be composed of a metal. In one example, the electrode contact is composed of tungsten (W). However, the present disclosure is not limited to only this example. The electrode contact 40 can be other conductive metals, such as copper (Cu), aluminum (Al), titanium (Ti) and platinum (Pt).

In another aspect, a semiconductor device including semiconductor fin structures is provided that includes an oxygen scavenging metal containing layer 35 on the sidewalls of a gate structure 40, 26a, 26b at the interface with a gate cut region 30. In one embodiment, the semiconductor device includes a first set of semiconductor fin structures 15 on a first portion 10 of a substrate, and a second set of semiconductor fin structures 25 on a second portion 20 of the substrate. The first and second portions 10, 20 of the substrate containing the first and second sets of semiconductor fin structures 15, 25 are separated by an isolation region 5. A first gate structure 40, 26a is present on the first set of semiconductor fin structures 25, and a second gate structure 40, 26b is present on the second set of semiconductor fin structures. A gate cut isolation region is present over the isolation region. An oxygen scavenging metal containing layer is present on sidewalls of the gate cut isolation region that separates the gate cut isolation region from the first and second gate structures.

Figure 16:
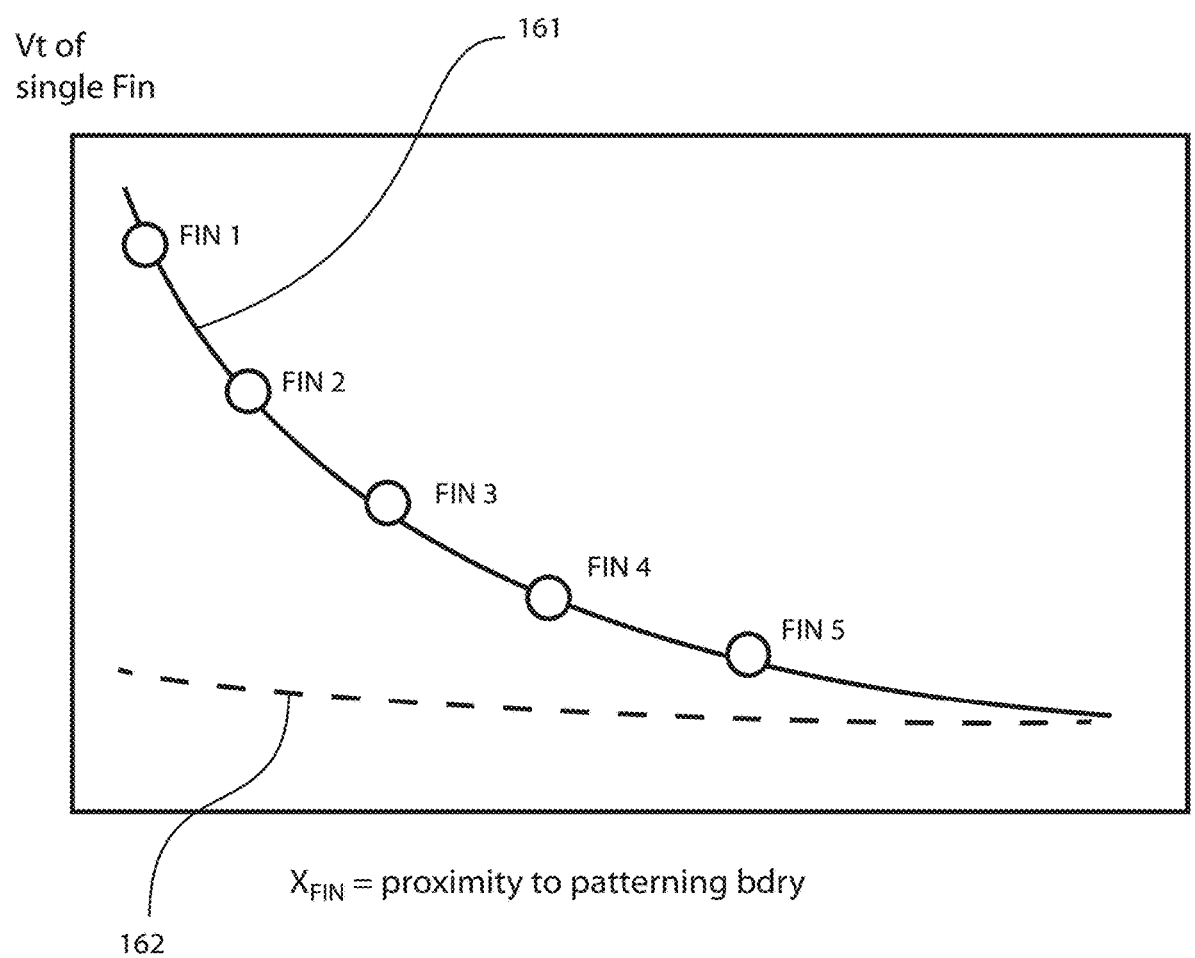
FIG. 16 is a plot illustrating the effect of the oxygen scavenging metal on the threshold voltage of FinFETs, in accordance with one embodiment of the present disclosure.

The oxygen scavenging metal containing layer 35 provided at gate cut region eliminates the threshold voltage (Vt) shift that is most prominent in devices including fin structures closest to the gate cut. This is illustrated in FIG. 16. In FIG. 16, the Y-axis represents threshold voltage for a fin structure, and the X-axis represents the distance of the fin structure from the gate cut region. For example, FIN 1 is closer to the gate cut region than FIN 5. The plot identified by reference number 161 represents the threshold voltage measured from a device structure in which the oxygen scavenging metal containing layer 35 is not present, while the plot identified by reference number 162 illustrates the threshold voltage measured from the device in which the oxygen scavenging metal containing layer 35 is present. As illustrated by plot 161 of FIG. 16, there is a large shift in the threshold voltage between FIN 1 that is closest to the gate cut region and FIN 5 that is the farthest from the gate cut region when the oxygen scavenging metal containing layer 35 is not present. Review of plot 162 of FIG. 16 illustrates that when the oxygen scavenging metal containing layer 35 is present the threshold voltage shift is minimized.

Figure 7:
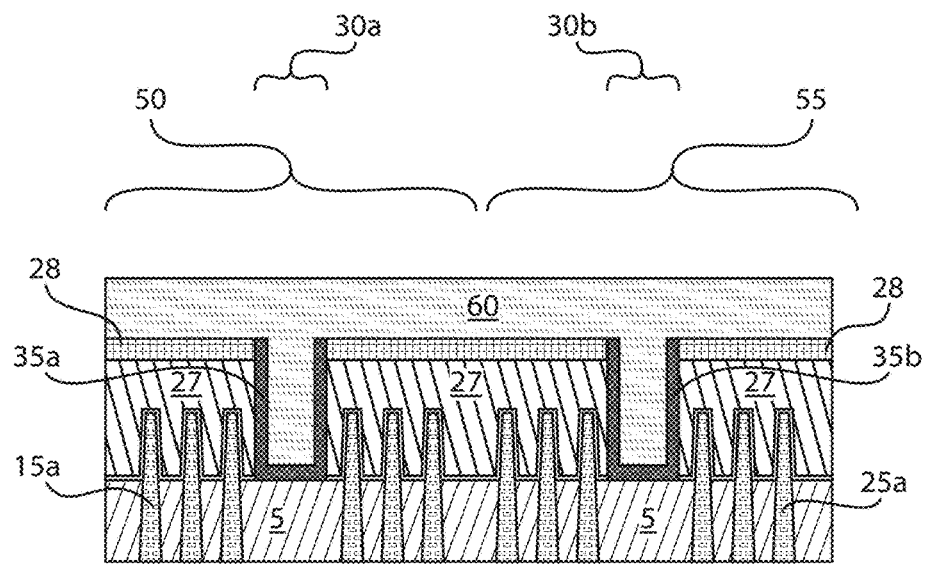
FIG. 7 is a side cross-sectional view depicting an n-type semiconductor device region and a p-type semiconductor device region, in which a gate cut region having an oxygen scavenging metal containing layer is present in each of the n-type and p-type device regions, in accordance with one embodiment of the present disclosure.

FIG. 7 depicts an n-type semiconductor device region 50 and a p-type semiconductor device region 55, in which a gate cut region 30a, 30b having an oxygen scavenging metal containing layer 35a, 35b is present in each of the n-type and p-type device regions 50, 55. The n-type semiconductor device region 50 includes a first set of fin structures 15a and n-type source and drain region regions. The p-type semiconductor device region 55 includes a second set of fin structures 25b and p-type source and drain regions. The gate cut region 30a, 30b is present separating groupings of fin structures 15a, 25a in each of the n-type and p-type device regions 50, 55. It is noted that the description for the fin structures 15, 25 that is provided above with reference to FIGS. 1-6 is suitable for describing at least one embodiment of the fin structures 15a, 25a that are depicted in FIG. 7. It is noted that the description for the oxygen scavenging metal containing layer 35, and the gate cut region 30, that is provided above with reference to FIGS. 1-6 is suitable for describing at least one embodiment of the oxygen scavenging metal containing layer 35a, 35b and the gate cut regions 30a, 30b that are depicted in FIG. 7.

FIG. 7 further depicts that a block mask layer 60 is blanket deposited atop the n-type and p-type device regions 50, 55. The block mask layer 60 may be composed of a photoresist material. It is noted that any material layer that can be selectively removed relative to the underlying structures depicted in FIG. 7 may serve as the composition for the block mask layer 60.

Figure 8:
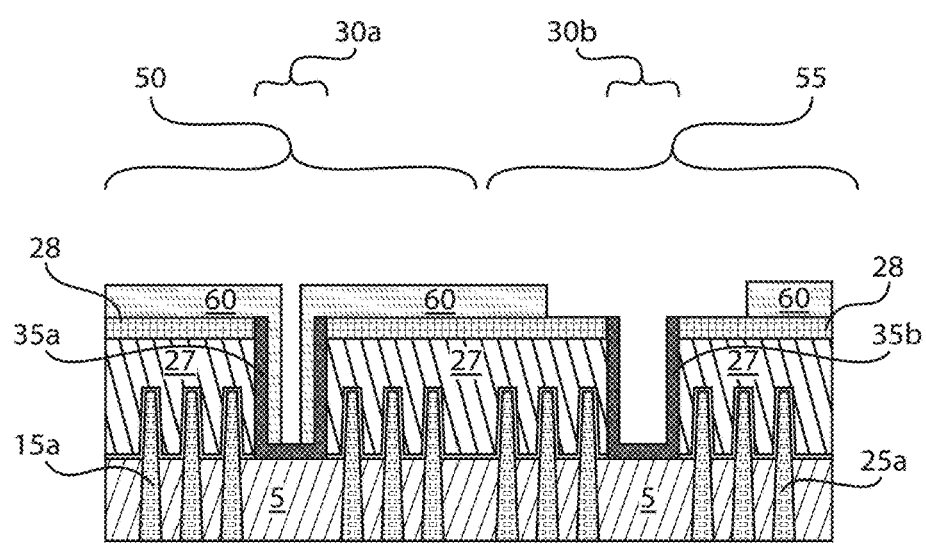
FIG. 8 is a side cross-sectional view depicting removing the masking from the structure depicted in FIG. 7 to expose the oxygen scavenging metal containing layer that is present in the p-type device region.

FIG. 8 depicts one embodiment of patterning the block mask layer 60 to expose the oxygen scavenging metal containing layer 35b that is present in the p-type device region 55. For example, when the block mask layer 60 is composed of a photoresist material layer, patterning the block mask layer 60 includes applying a photoresist to the surface to be etched; exposing the photoresist to a pattern of radiation; and then developing the pattern into the photoresist utilizing a resist developer. Once the patterning of the photoresist, i.e., block mask layer 60, is completed, the sections covered by the photoresist, i.e., patterned block mask layer 60, are protected while the exposed regions are removed using a selective etching process that removes the unprotected regions. In the example that is depicted in FIG. 8, an entirety of the oxygen scavenging metal containing layer 35b that is present in the p-type device region 55 is exposed by the patterned block mask layer 60, while only a portion of the oxygen scavenging metal containing layer 35a that is present in the n-type device region 50 is exposed by the patterned block mask layer 60. More specifically, the portion of the block mask layer 60 that is present in the n-type device region 50 protects the vertically orientated portions of the oxygen scavenging metal containing layer 35a that are present on the sidewalls of the gate cut region 30a to ensure that they remain in the final structure. The portion of the block mask layer 60 that is present in the n-type device region 50 exposes the horizontally orientated portions of the oxygen scavenging metal containing layer 35a that are present at the baes of the gate cut region 30a to ensure that this portion of the oxygen scavenging metal containing layer 35a is removed to avoid shorting of the devices on opposing sides of the gate cut region 30a.

Figure 9:
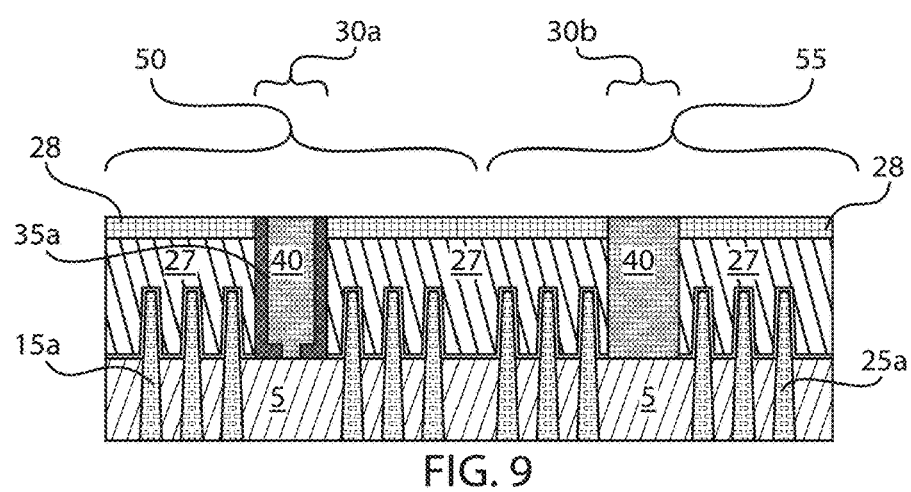
FIG. 9 is a side cross-sectional view depicting removing the oxygen scavenging metal containing layer from the p-type region, while the oxygen scavenging metal containing layer remains in the n-type region.

FIG. 9 depicts removing the oxygen scavenging metal containing layer 35b from the p-type region 55, and removing the horizontally orientated portion of the oxygen scavenging metal containing layer 35a that is present in the n-type region 50, wherein the vertically orientated portion of the oxygen scavenging metal containing layer 35a remains in the n-type device region 50. This provides that the oxygen scavenging metal containing layer 35a eliminates threshold voltage shifts for the devices in the n-type device region 50. The exposed portions of the oxygen scavenging metal containing layer 35a, 35b may be removed by an etch process, such as reactive ion etching. Following etching of the oxygen scavenging metal containing layer 35a, 35b, a dielectric fill 60 may be formed in each of the gate cut regions 30a, 30b. The dielectric fill 60 may be composed of silicon nitride. Further details regarding the formation of the dielectric fill 60 can be found with reference to the description of the dielectric fill 60 in FIG. 5. Following fill the gate cut regions 30a, 30b with the dielectric fill 60, the remaining portions of the organic planarization layer 27 may be removed using a selective etch process, and an electrode contact 40 may be formed to each of the gate stacks 26a, 26b. The electrode contact 40 may be composed of a metal. In one example, the electrode contact is composed of tungsten (W). However, the present disclosure is not limited to only this example. The electrode contact 40 can be other conductive metals, such as copper (Cu), aluminum (Al), titanium (Ti) and platinum (Pt).

Figure 11:
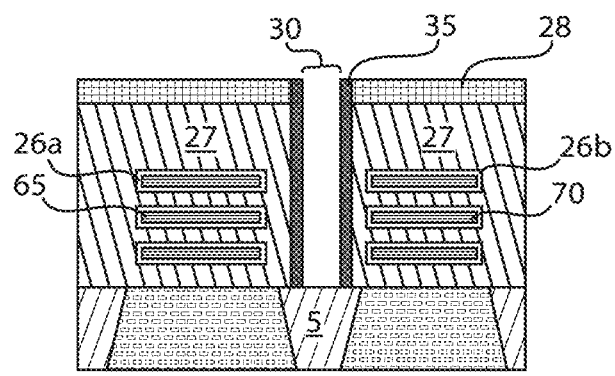
FIG. 11 is a side cross-sectional view depicting an oxygen scavenging metal containing layer being formed on sidewalls of the gate cut region, in accordance with one embodiment of the present disclosure.
Figure 12:
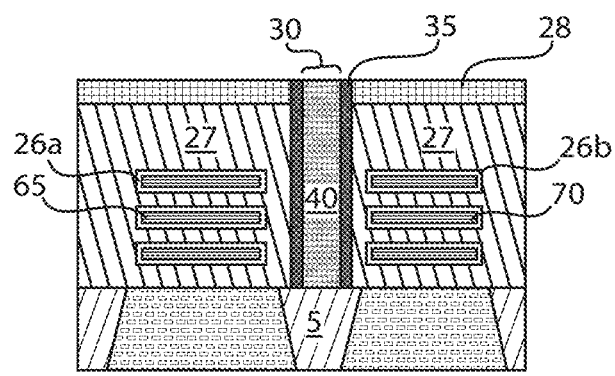
FIG. 12 is a side cross-sectional view depicting a dielectric fill being formed on the oxygen scavenging metal containing layer that is depicted in FIG. 11 filling gate cut region.

The methods and structures of the present disclosure are not limited to only FinFET type devices. For example, FIGS. 10-12 illustrate one embodiment of forming nanosheet devices employing a gate cut region having an oxygen scavenging metal containing layer therein.

Figure 10:
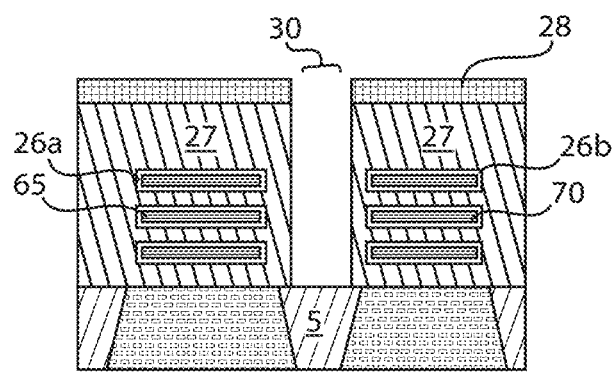
FIG. 10 is a side cross-sectional view depicting one embodiment of a first set of nanosheet structures on a first portion of a substrate, a second set of nanosheet structures on a second portion of the substrate, and a gate cut region separating a first gate structure present on the first set of nanosheet structures and a second gate structure present on a second set of nanosheet structures.

FIG. 10 depicts one embodiment of a first set of nanosheet structures 65 on a first portion 10 of a substrate, a second set of nanosheet structures 70 on a second portion 20 of the substrate, and a gate cut region 30 separating a first gate structure 26a present on the first set of nanosheet structures 65 and a second gate structure 26b present on a second set of nanosheet structures 70.

Nanosheet structures 65, 70 are semiconductor material layers that can be employed as suspended channel structures. To provide these structures, stacks of semiconductor material layers are provided in which one of the compositions for a material layer within the stack is sacrificial, i.e., removed, and one of the material layers remains in the structure to provide the nanosheets. By "suspended channel" it is meant that at least one semiconductor material layer is present overlying the substrate, wherein the sidewalls of the suspended channel are supported, e.g., anchored, in a structure, such as a spacer abutting the gate structure. Gate structure materials, electrically conductive materials and/or semiconductor materials may be formed in the space surrounding the suspended structures. In some embodiments, the suspended channel structures have a nanosheet geometry. The term "nanosheet" denotes a substantially two dimensional structure with thickness in a scale ranging from 1 to 100 nm. The width and length dimensions of the nanosheet may be greater than the width dimensions.

The nanosheets 65, 70 that are depicted in FIG. 10 are substituted for the fin structures 15, 25 that are depicted in FIG. 1. The process flow that is depicted in FIGS. 1-6 is similar to the process flow that is describe herein with reference to FIGS. 10-12 with the exception that the nanosheets 65, 70 are being substituted for the fin structures 15, 25. Therefore, each of the structures depicted in FIG. 10 have the same reference numbers that are included in FIGS. 1-6 are substantially the same in function. For example, the gate stacks 26a, 26b, the organic planarization layer 27, the photoresist layer 28 and the gate cut region 30 that is depicted in FIG. 10 can be described using the description for the structures having the same reference numbers in FIGS. 1 and 2.

FIG. 11 depicts an oxygen scavenging metal containing layer 35 being formed on sidewalls of the gate cut region 30. The formation of the oxygen scavenging metal containing layer 35 being formed on sidewalls of the gate cut region 30 that is depicted in FIG. 11 is similar to the oxygen scavenging metal containing layer 35 that is depicted in FIGS. 3A-4B. Therefore, the description for forming the oxygen scavenging metal containing layer 35 that is depicted in FIGS. 3A-4B can provide one embodiment for forming the oxygen scavenging metal containing layer 35 that is depicted in FIG. 11.

FIG. 12 depicts a dielectric fill 60 being formed on the oxygen scavenging metal containing layer 35 that is depicted in FIG. 11 filling gate cut region 30. The dielectric fill 60 that is depicted in FIG. 12 is similar to the oxygen scavenging metal containing layer 35 that is depicted in FIG. 5. Therefore, the description for forming the dielectric fill 60 that is depicted in FIG. 5 can provide one embodiment for forming the dielectric fill 60 that is depicted in FIG. 12.

Following the formation of the dielectric fill 60, the remaining portions of the organic planarization layer 27 may be removed, and replaced with a gate electrode contact. The gate electrode contact has been described above with reference to FIG. 6.

The method described with reference to FIGS. 10-12 can provide a semiconductor device including nanosheets 65, 70 that includes an oxygen scavenging metal containing layer 35 on the sidewalls of a gate structure 26a, 26b at the interface with a gate cut region 30. In one embodiment, the semiconductor device includes a first set of nanosheets 65 on a first portion 10 of a substrate, and a second set of nanosheets 70 on a second portion 20 of the substrate. The first and second portions 10, 20 of the substrate containing the first and second sets of nanosheets 65, 70 are separated by an isolation region 5. A first gate structure 26a is present on the first set of nanosheets 65, and a second gate structure 26b is present on the second set of nanosheets 70. A gate cut isolation region 30 is present over the isolation region 5. An oxygen scavenging metal containing layer 35 is present on sidewalls of the gate cut isolation region 5 that separates the gate cut isolation region 30 from the first and second gate structures 26a, 26b.

The oxygen scavenging metal containing layer 35 provided at the gate cut region eliminates the threshold voltage (Vt) shift that is most prominent in devices including fin structures closes to the gate cut. This is illustrated in FIG. 16. In FIG. 16, the Y-axis represents threshold voltage for a fin structure, and the X-axis represents the distance of the fin structure from the gate cut region. For example, FIN 1 is closer to the gate cut region than FIN 5. The plot identified by reference number 161 represents the threshold voltage measured from a device structure in which the oxygen scavenging metal containing layer 35 is not present, while the plot identified by reference number 162 illustrates the threshold voltage measured from the device in which the oxygen scavenging metal containing layer 35 is present. As illustrated by plot 161 of FIG. 16, there is a large shift in the threshold voltage between FIN 1 that is closest to the gate cut region and FIN 5 that is the farthest from the gate cut region when the oxygen scavenging metal containing layer 35 is not present. Review of plot 162 of FIG. 16 illustrates that when the oxygen scavenging metal containing layer 35 is present the threshold voltage shift is minimized.

The methods describe herein are equally applicable to double patterning methods. FIG. 13 depicts forming a second patterning layer stack on the structure depicted in FIG. 5. The second patterning layer stack can include a hardmask layer 75, which can both be composed of a dielectric material.

FIG. 14 depicts forming a masking layer 80 within an opening through the second patterning layer that is provided by the hardmask layer 75 that is depicted in FIG. 13. The masking layer 80 may be conformally deposited, and may be composed of a dielectric material.

FIG. 15 depicting etching the fill 60 that is present in the gate cut region 30 using the masking layer 80 depicted in FIG. 14. The etch process may be an anisotropic etch, such as reactive ion etching.

Having described preferred embodiments of a structure and method for providing threshold voltage adjustments from oxygen vacancies by scavenge metal filling at the gate cut (CT), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of controlling threshold voltage shift comprising:
    forming a first set of channel semiconductor structures on a first portion of a substrate;
        forming a second set of channel semiconductor structures on a second portion of the substrate;
        forming a gate structure on the first set of channel semiconductor structures and the second set of channel semiconductor structures, wherein the gate structure extends from a first portion of the substrate over an isolation region to a second portion of the substrate;
        forming a gate cut region is formed in the gate structure over the isolation region;
        forming an oxygen scavenging metal containing layer on sidewalls of the gate cut region; and
        forming a dielectric fill on the oxygen scavenging metal containing layer filling the gate cut region.

2. The method of claim 1, wherein at least one of the first and second set of channel semiconductor structures comprises fin structures.

3. The method of claim 2, wherein the n-type semiconductor devices are a first device type region of a substrate, and p-type semiconductor devices are in a second device type region of the substrate, wherein the oxygen scavenging metal containing layer is removed from the p-type semiconductor devices that are in the second device type region of the substrate.

4. The method of claim 1, wherein at least one of the first and second set of channel semiconductor structures comprises nanosheets.

5. The method of claim 1, wherein the gate structure comprises a gate dielectric and a work function metal gate conductor.

6. The method of claim 1, wherein the oxygen scavenging metal containing layer is selected from the group consisting of titanium, aluminum, titanium aluminum, titanium aluminum carbon and combinations thereof.

7. The method of claim 1, wherein the oxygen scavenging metal containing layer is deposited by atomic layer deposition.

8. The method of claim 1, wherein the first and second set of channel semiconductor structures are components of n-type semiconductor devices.

9. The method of claim 1, wherein the dielectric fill comprises silicon nitride.

* * * * *